US010217896B2

(12) United States Patent
Rudolph et al.

(10) Patent No.: US 10,217,896 B2
(45) Date of Patent: Feb. 26, 2019

(54) LIGHT EMITTING DIODE CHIP HAVING TEMPERATURE COMPENSATION OF THE WAVELENGTH

(71) Applicant: OSRAM Opto Semiconductors GmbH, Regensburg (DE)

(72) Inventors: Andreas Rudolph, Regensburg (DE); Petrus Sundgren, Lappersdorf (DE); Ivar Tangring, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/532,236

(22) PCT Filed: Nov. 25, 2015

(86) PCT No.: PCT/EP2015/077661
§ 371 (c)(1),
(2) Date: Jun. 1, 2017

(87) PCT Pub. No.: WO2016/087284
PCT Pub. Date: Jun. 9, 2016

(65) Prior Publication Data
US 2017/0271553 A1   Sep. 21, 2017

(30) Foreign Application Priority Data

Dec. 1, 2014 (DE) .................... 10 2014 117 611

(51) Int. Cl.
*H01L 33/06* (2010.01)
*H01L 33/08* (2010.01)

(52) U.S. Cl.
CPC .............. *H01L 33/06* (2013.01); *H01L 33/08* (2013.01)

(58) Field of Classification Search
CPC .............................. H01L 33/06; H01L 33/08
See application file for complete search history.

(56) References Cited

U.S. PATENT DOCUMENTS 5,959,307 A    9/1999  Nakamura et al.
9,123,851 B2   9/2015  Goda et al.
(Continued)

FOREIGN PATENT DOCUMENTS

DE    102006046237 A1    1/2008
DE    102011115312 A1    4/2013
(Continued)

*Primary Examiner* — Jay C Chang
*Assistant Examiner* — Mikka Liu
(74) *Attorney, Agent, or Firm* — Slater Matsil, LLP (57) ABSTRACT

An optoelectronic semiconductor chip is disclosed. In an embodiment the optoelectronic semiconductor chip includes a p-type semiconductor region, an n-type semiconductor region, and an active layer arranged between the p-type semiconductor region and the n-type semiconductor region. The active layer is designed as a multiple quantum well structure, wherein the multiple quantum well structure has a first region of alternating first quantum well layers and first barrier layers and a second region having at least one second quantum well layer and at least one second barrier layer. The at least one second quantum well layer has an electronic band gap ($E_{QW2}$) that is less than the electronic band gap ($E_{QW1}$) of the first quantum well layers, and the at least one second barrier layer has an electronic band gap ($E_{B2}$) that is greater than the electronic band gap ($E_{B1}$) of the first barrier layers.

15 Claims, 4 Drawing Sheets

(56) References Cited

U.S. PATENT DOCUMENTS

| | | |
|---|---|---|
| 9,331,238 B2 | 5/2016 | Tangring et al. |
| 2003/0151044 A1* | 8/2003 | Yamada .................. B82Y 20/00 257/14 |
| 2003/0209704 A1 | 11/2003 | Yamada |
| 2006/0086932 A1 | 4/2006 | Kim et al. |
| 2007/0090339 A1 | 4/2007 | Lee et al. |
| 2009/0045392 A1* | 2/2009 | Park ....................... B82Y 20/00 257/13 |
| 2011/0101301 A1* | 5/2011 | Lin ......................... H01L 33/06 257/13 |
| 2013/0001509 A1 | 1/2013 | Fudeta et al. |
| 2013/0082238 A1 | 4/2013 | Hsieh et al. |
| 2013/0228746 A1 | 9/2013 | Moon et al. |
| 2013/0328011 A1 | 12/2013 | Teranishi et al. |
| 2014/0048768 A1 | 2/2014 | Lee et al. |
| 2014/0166980 A1* | 6/2014 | Goda ..................... H01L 33/06 257/13 |
| 2016/0181471 A1 | 6/2016 | Tangring et al. |

FOREIGN PATENT DOCUMENTS

| | | |
|---|---|---|
| DE | 102013107969 A1 | 1/2015 |
| EP | 2405494 A2 | 1/2012 |
| WO | 2013015035 A1 | 1/2013 |

\* cited by examiner

LIGHT EMITTING DIODE CHIP HAVING TEMPERATURE COMPENSATION OF THE WAVELENGTH

This patent application is a national phase filing under section 371 of PCT/EP2015/077661, filed Nov. 25, 2015, which claims the priority of German patent application 10 2014 117 611.1, filed Dec. 1, 2014, each of which is incorporated herein by reference in its entirety.

TECHNICAL FIELD

The invention relates to an optoelectronic semiconductor chip.

BACKGROUND

The optical and electronic properties of semiconductor materials are largely determined by the bandgap, i.e., the difference in energy between the valence band and the conduction band. The bandgap of semiconductor materials generally decreases with rising temperature. For radiation-emitting optoelectronic semiconductor chips such as LEDs or semiconductor lasers, for example, this can result in the wavelength of the emitted radiation increasing with rising operating temperature. This can alter the perceived color of the emitted radiation.

It is also known that the sensitivity of the human eye decreases at wavelengths above about 560 nm. Thus for optoelectronic semiconductor chips that emit at relatively large wavelengths, a temperature-induced increase in the emission wavelength can result in not only a change in the perceived colour but also in a reduction in the visually perceived brightness.

SUMMARY OF THE INVENTION

Embodiments of the invention provide a radiation-emitting optoelectronic semiconductor chip having a reduced temperature-dependence of the radiation emission.

According to at least one embodiment, the optoelectronic semiconductor chip comprises a p-type semiconductor region, an n-type semiconductor region and an active layer, which is arranged between the p-type semiconductor region and the n-type semiconductor region and is embodied as a multiple quantum well structure.

According to at least one embodiment, the multiple quantum well structure comprises a first region containing alternating first quantum well layers and first barrier layers, and comprises a second region containing at least one second quantum well layer and at least one second barrier layer, preferably containing a plurality of alternating second quantum well layers and second barrier layers. In particular, the first region and the second region can each comprise a plurality of layer pairs, wherein the layer pairs in the first region each comprise a first quantum well layer and a first barrier layer, and in the second region each comprise a second quantum well layer and a second barrier layer. The first barrier layers each have a larger bandgap than the first quantum well layers, and the at least one second barrier layer has a larger bandgap than the at least one second quantum well layer.

According to at least one embodiment, the at least one second quantum well layer has a bandgap $E_{QW2}$ which is smaller than the bandgap $E_{QW1}$ of the first quantum well layers. In addition, the at least one second barrier layer has a bandgap $E_{B2}$ which is larger than the bandgap $E_{B1}$ of the first barrier layers. The second region is arranged closer to the p-type semiconductor region than is the first region. In particular, the first region can adjoin the n-type semiconductor region, and the second region can adjoin the p-type semiconductor region. The multiple quantum well structure preferably consists of the first region and the second region, i.e., it does not comprise any other layers.

As a result of the multiple quantum well structure comprising in the second region, on the side that faces the p-type semiconductor region, at least one second barrier layer that has a bandgap $E_{B2}$ that is larger than the bandgap $E_{B1}$ of the barrier layers in the first region, movement of holes in the multiple quantum well structure is more difficult in the vicinity of the p-type semiconductor region. It has been found in particular that the at least one second barrier layer having larger bandgap $E_{B2}$ impedes the mobility of holes more strongly than it impedes the mobility of electrons. Thus the effect of the at least one barrier laying having the larger bandgap $E_{B2}$ is that, at least at low operating temperatures, the holes cannot spread unimpeded into the first region of the quantum well structure, and thus there is a higher concentration of holes in the second region of the quantum well structure. Therefore at low operating temperatures, there is a greater probability of radiative recombinations of electrons and holes taking place in the second region of the quantum well structure.

As the operating temperature rises, the mobility of the holes increases, with the result that they can pass more easily through the at least one barrier layer in the second region. As a consequence, the distribution of the charge carriers in the multiple quantum well structure becomes increasingly uniform as the operating temperature increases. This has the effect that with a rise in the operating temperature there is an increasing number of radiative recombinations of electrons and holes taking place also in the quantum well layers of the first region, which layers have a larger bandgap.

Since the bandgap $E_{QW2}$ of the at least one quantum well layer in the second region is smaller than the bandgap $E_{QW1}$ of the quantum well layers in the first region, the at least one quantum well layer of the second region has a longer emission wavelength than the quantum well layers of the first region. Thus the at least one second quantum well layer, which has a longer emission wavelength, makes a greater contribution to the radiation emission at low operating temperatures. With rising operating temperature, the first quantum well layers, which have a shorter emission wavelength, make an increasing contribution to the radiation emission.

This advantageously compensates fully or partially the effect that the reduction in the bandgap of the semiconductor material of the quantum well layers with rising operating temperature would have without the advantageous measures described in this document, namely that of the emission wavelength increasing with rising operating temperature and the emission spectrum shifting towards a longer wavelength. As a result of the counteractive effect of the multiple quantum well structure described in this document, it can advantageously be achieved that the emission spectrum of the multiple quantum well structure does not change substantially and preferably is not dependent on temperature.

In order to achieve partial or even full compensation of the temperature-induced decrease in the electronic bandgap of the semiconductor material, it is advantageous if the bandgap $E_{QW1}$ of the first quantum well layers is at least 0.025 eV larger than the bandgap $E_{QW2}$ of the at least one second quantum well layer. Preferably, the bandgap $E_{QW1}$ of the first quantum well layers is at least 0.05 eV larger, more preferably 0.1 eV larger, than the bandgap $E_{QW2}$ of the at least one second quantum well layer.

The compensating effect of the second region of the quantum well structure on the temperature-induced decrease in the electronic bandgap also depends on the size of the bandgap $E_{B2}$ of the at least one second barrier layer. The larger the bandgap $E_{B2}$ of the at least one second barrier layer, the greater is the concentration of holes in the second region at low operating temperatures, and hence the stronger the effect of an increase in the operating temperature. The bandgap $E_{B2}$ of the at least one second barrier layer is advantageously at least 0.075 eV larger than the bandgap $E_{B1}$ of the first barrier layers. Preferably, the bandgap $E_{B2}$ of the at least one second barrier layer is at least 0.15 eV larger, more preferably 0.225 eV larger, than the bandgap $E_{B1}$ of the first barrier layers.

According to a preferred embodiment, the multiple quantum well structure is based on a phosphide compound semiconductor, arsenide compound semiconductor or nitride compound semiconductor. In particular, the first quantum well layers and the at least one second quantum well layer can each contain $In_xAl_yGa_{1-x-y}P$, $In_xAl_yGa_{1-x-y}As$ or $In_xAl_yGa_{1-x-y}N$, where $0 \leq x \leq 1$, $0 \leq y \leq 1$ and $x+y \leq 1$. In addition, the first barrier layers and the at least one second barrier layer can each contain $In_xAl_yGa_{1-x-y}P$, $In_xAl_yGa_{1-x-y}As$ or $In_xAl_yGa_{1-x-y}N$, where $0 \leq x \leq 1$, $0 \leq y \leq 1$ and $x+y \leq 1$.

The bandgap of the barrier layers and/or quantum well layers can be adjusted in particular by the material composition. Increasing the bandgap can be achieved in particular by increasing the aluminum content y and/or decreasing the indium content x. Thus the aluminum content y of the first quantum well layers is preferably greater than the aluminum content y of the at least one second quantum well layer, and/or the indium content x of the first quantum well layers is less than the indium content x of the at least one second quantum well layer.

For the barrier layers it holds that preferably the aluminum content y of the first barrier layers is less than the aluminum content y of the at least one second barrier layer, and/or the indium content x of the first barrier layers is greater than the indium content x of the at least one second barrier layer.

In an advantageous embodiment, the first region comprises at least ten layer pairs, preferably at least thirty layer pairs, composed of first quantum well layers and first barrier layers. The second region advantageously comprises at least one layer pair, composed of a second quantum well layer and a second barrier layer, preferably at least three layer pairs, composed of second quantum well layers and second barrier layers. The larger the number of layer pairs in the second region, the greater the effect of the second region on the emission spectrum of the optoelectronic semiconductor chip.

The number of layer pairs in the first region is advantageously greater than the number of layer pairs in the second region. The number of layer pairs in the first region is preferably at least five times as large, more preferably at least 10 times as large, as the number of layer pairs in the second region. In this case, the overall emission spectrum of the optoelectronic semiconductor chip is mainly determined by the first region. The second region, which has a lower number of layer pairs than the first region, is advantageously used to compensate the temperature dependence of the bandgap of the layer pairs of the first region, this being done by the second region producing radiation of a longer wavelength, which is incorporated in the overall emission spectrum in particular at low operating temperatures owing to the lower mobility of the holes. This incorporation of radiation of longer wavelength decreases with increasing temperature.

In a preferred embodiment, for a temperature rise of $T_1=25°$ C. to $T_2=85°$ C., the dominant wavelength of the radiation emitted by the active layer changes by no more than 4 nm, preferably by no more than 2 nm and more preferably does not change at all. In other words, for a temperature rise of $T_1=25°$ C. to $T_2=85°$ C., the dominant wavelength increases or decreases by less than 4 nm and preferably even remains constant.

BRIEF DESCRIPTION OF THE DRAWINGS

The invention is explained in more detail below using exemplary embodiments with reference to FIGS. 1 to 7, in which.

In each of the figures, the same reference numbers are used to denote identical or equivalent elements. The elements shown and the relative sizes thereof shall not be considered to be to scale.

DETAILED DESCRIPTION OF ILLUSTRATIVE EMBODIMENTS

Figure 1:
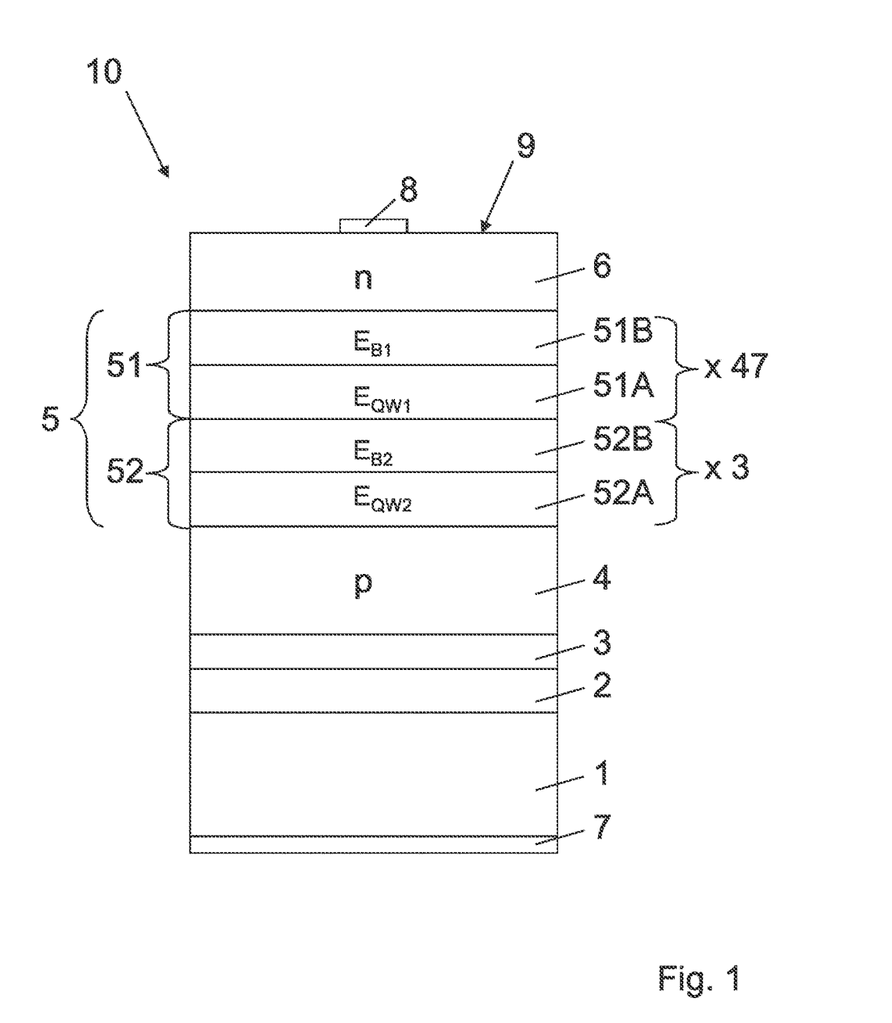
FIG. 1 is a schematic diagram of a cross-section through an optoelectronic semiconductor chip according to an exemplified embodiment.

The optoelectronic semiconductor chip 10 shown in FIG. 1 according to an exemplified embodiment is an LED chip, which comprises a p-type semiconductor region 4, an n-type semiconductor region 6 and an active layer 5, which is arranged between the p-type semiconductor region 4 and the n-type semiconductor region 6 and is adapted for emitting radiation. The exemplified embodiment of the optoelectronic semiconductor chip 10 is what is known as a thin-film semiconductor chip, from which a growth substrate has been removed that was used originally for epitaxial growth of the semiconductor layers 4, 5, 6, and instead the semiconductor layer stack has been bonded by means of a bonding layer 2, in particular a solder layer, to a carrier substrate 1 that is different from the growth substrate.

In a thin film LED chip 10 of this type, the p-type semiconductor region 4 typically faces the carrier substrate 1. A mirror layer 3, which advantageously deflects radiation emitted towards the carrier substrate 1 towards a radiation exit surface 9 of the optoelectronic semiconductor chip, is advantageously arranged between the p-type semiconductor region 4 and the carrier substrate 1. The mirror layer 3 is a metal layer, for example, which contains Ag, Al or Au.

For the purpose of making electrical contact with the optoelectronic semiconductor chip 10, for example, a first contact layer 7 can be provided on a rear face of the carrier substrate 1, and a second contact layer 8 can be provided on a partial region of the radiation exit surface 9.

The p-type semiconductor region 4 and the n-type semiconductor region 6 can each be constructed from a plurality of sublayers and need not necessarily consist of solely p-type layers or n-type layers, but, for example, can also comprise one or more undoped layers.

As an alternative to the exemplified embodiment shown, the optoelectronic semiconductor chip 10 could also have an opposite polarity, i.e., the n-type semiconductor region 6 could face a substrate, and the p-type semiconductor region 4 could face a radiation exit surface 9 of the optoelectronic semiconductor chip (not shown). This is typically the case for optoelectronic semiconductor chips for which the growth substrate used for the epitaxial growth of the semiconductor layers has not been removed, because usually the n-type semiconductor region is grown first onto the growth substrate.

The active layer 5 of the optoelectronic semiconductor chip 10, which layer is intended for emission of radiation, is embodied as a multiple quantum well structure 51, 52. The multiple quantum well structure 51, 52 comprises a plurality of alternately arranged quantum well layers 51A, 52A and barrier layers 51B, 52B. In the exemplified embodiment shown, the multiple quantum well structure comprises 50 layer pairs each composed of a quantum well layer 51A, 52A and a barrier layer 51B, 52B.

The multiple quantum well structure contains a first region 51, which comprises forty-seven layer pairs each composed of a first quantum well layer 51A and a first barrier layer 51B. In addition, the multiple quantum well structure contains a second region 52, which comprises three layer pairs each composed of a second quantum well layer 52A and a second barrier layer 52B. The first region 51 is arranged closer to the n-type semiconductor region 6 than is the second region 52, and preferably directly adjoins the n-type semiconductor region 6. The second region 52 is arranged closer to the p-type semiconductor region 4 and preferably directly adjoins the p-type semiconductor region 4.

In the first region 51, the quantum well layers 51A have a bandgap $E_{QW1}$, and the barrier layers 51B have a bandgap $E_{B1} > E_{QW1}$. In the second region, the quantum well layers 52A have a bandgap $E_{QW2}$, and the barrier layers 52B have a bandgap $E_{B2} > E_{QW2}$. For the bandgaps of the quantum well layers it holds that $E_{QW2} < E_{QW1}$, and for the bandgaps of the barrier layers it holds that $E_B2 > E_{B1}$.

In the second region 52, which is arranged closer to the p-type semiconductor region 4, the bandgaps of the quantum well layers 52A are thus reduced compared with the bandgaps of the quantum well layers 51A of the first region 51. At the same time, the bandgaps of the barrier layers 52B of the second region are increased compared with the bandgaps of the barrier layers 51B of the first region 51.

The bandgap of the second quantum well layers 52A is advantageously at least 0.025 eV, preferably at least 0.050 eV and more preferably at least 0.1 eV smaller than the bandgap of the first quantum well layers 51A. In addition, the bandgap of the second barrier layers 52B is advantageously at least 0.075 eV, preferably at least 0.15 eV and more preferably at least 0.225 eV larger than the bandgap of the first barrier layers 51B.

The bandgap of the semiconductor materials of the quantum well layers 51A, 52A and barrier layers 51B, 52B can be adjusted in particular by varying the aluminum content and/or the indium content in the semiconductor material. For example, the quantum well layers and barrier layers can contain semiconductor materials having the composition $In_xAl_yGa_{1-x-y}P$, $In_xAl_yGa_{1-x-y}As$ or $In_xAl_yGa_{1-x-y}N$, where $0 \leq x \leq 1$, $0 \leq y \leq 1$ and $x+y \leq 1$. For these types of semiconductors, the bandgap increases with increasing aluminum content y and decreases with increasing indium content x.

In the exemplified embodiment, the first quantum layers contain $In_{0.5}Al_{0.05}Ga_{0.45}P$, the first barrier layers contain $In_{0.5}Al_{0.30}Ga_{0.20}P$, the second quantum well layers contain $In_{0.5}Ga_{0.50}P$, and the second barrier layers contain $In_{0.5}Al_{0.50}P$.

The effect of the increased bandgap of the barrier layers of the second region 52 is to make it harder for holes to move from the p-type semiconductor region 4 towards the n-type semiconductor region 6 in particular at low operating temperatures, because at low operating temperatures the holes can pass only with difficulty through the barrier layers 52B having increased bandgap $E_{B2}$. As the operating temperature increases, the mobility of the holes increases, with the result that they can pass through the barrier layers 52B more easily and can hence be distributed more evenly in the multiple quantum well structure 51, 52.

It is thereby achieved that at low operating temperatures there is a higher occurrence of radiative recombinations of charge carriers in the second region 52, in which the quantum well layers 52A have a smaller bandgap and as a result a longer emission wavelength. With a rise in the operating temperature, as a result of the increasingly even distribution of the holes in the multiple quantum well structure, radiative recombinations occur to a greater extent also in the quantum well layers 51A of the first region 51, which have a larger bandgap and hence a shorter emission wavelength.

The design of the multiple quantum well structure described in this document thus in particular has the effect of reducing the emission wavelength with rising operating temperature. This counteracts the opposite effect of the bandgap of semiconductor materials reducing with increasing temperature and hence the emission wavelength increasing. The effect of a temperature-induced increase in the emission wavelength is advantageously partially, or preferably even fully, compensated by the multiple quantum well structure. It can be achieved in particular that the dominant wavelength of the radiation emitted by the active layer 5 does not increase or decrease by more than 4 nm for the temperature rise from a first temperature $T_1 = 25°$ C., which corresponds approximately to room temperature, to a second temperature $T_2 = 85°$ C., which corresponds approximately to the operating temperature of an LED.

The improved stability of the emission wavelength of the emitted radiation compared with a conventional multiple quantum well structure, in which all the barrier layers have the same bandgap and all the quantum well layers have the same bandgap, also has the advantage that the temperature dependence of the brightness perceived by the human eye of the emitted radiation is reduced. It is known that the sensitivity of the human eye varies in the visible spectral region and in particular reduces for wavelengths above about 560 nm. What is known as the eye-weighted brightness $I_v$, which takes into account the spectral sensitivity curve of the eye, can be used as a measure of the perceived brightness. A temperature-induced increase in the wavelength can hence result in a change in the eye-weighted brightness $I_v$, where the eye-weighted brightness $I_v$ decreases for a wavelength above about 560 nm.

In an experiment, the quotient of the eye-weighted brightness $I_v$ at $T=85°$ C. and $T=25°$ C. was determined for an optoelectronic semiconductor chip according to the exemplified embodiment and according to a comparative embodiment that was not based on the invention. In this experiment, $I_v(T=85°$ C.$)/I_v(T=25°$ C.$)=0.584$ was obtained for the optoelectronic semiconductor chip according to the invention, and $I_v(T=85°$ C.$)/I_v(T=25°$ C.$)=0.545$ was obtained for the comparative embodiment, with these values normalized to a wavelength of 615 nm. Thus for the exemplified embodiment, the eye-weighted brightness decreases less steeply with increasing temperature than for the comparative embodiment. In addition, the change in the dominant wavelength $\lambda_{dom}$(T) was measured for the temperature rise from T=25° C. to T=85° C. The change in the dominant wavelength $\lambda_{dom}$ (T) equals only 3.4 nm for the exemplified embodiment whereas it equals 4.8 nm for the comparative embodiment, again normalized to an emission wavelength of 615 nm. The optoelectronic semiconductor chip according to the exemplified embodiment is therefore characterized both by an improved temperature stability of the wavelength and by an improved stability of the eye-weighted brightness.

Figure 2:
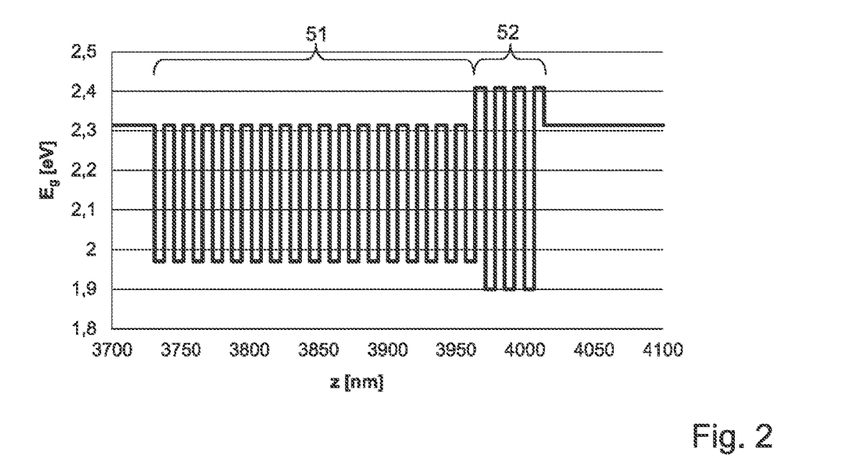
FIGS. 2 to 7 each show a graph of the electronic bandgap as a function of a spatial coordinate z running in the vertical direction for various exemplified embodiments of the optoelectronic semiconductor chip.

FIG. 2 shows the bandgap $E_g$ in the active layer of another exemplified embodiment of the optoelectronic semiconductor chip as a function of a spatial coordinate z. The bandgap $E_g$ defines the energy difference between the conduction band and the valence band. It can be seen from FIG. 2 that in the layer pairs of the first region 51, the bandgaps of the barrier layers are smaller than in the layer pairs of the second region 52, and the bandgaps of the quantum well layers are larger than in the layer pairs of said second region. In the exemplified embodiment of FIG. 2, the bandgaps of the barrier layers are of equal size in the second region 52, and also the bandgaps of the quantum well layers are each of equal size. It has been found, however, that stabilizing the dominant wavelength with a rise in temperature can also be achieved using other structures in which the bandgaps of the barrier layers in the second region 52 differ from one another and/or the bandgaps of the quantum well layers in the second region 52 differ from one another. Such quantum well structures are presented in the following exemplary embodiments.

FIGS. 3 to 7 each show the bandgap $E_g$ in the active layer of the optoelectronic semiconductor chip as a function of a spatial coordinate z for five further exemplified embodiments of the optoelectronic semiconductor chip.

Figure 3:
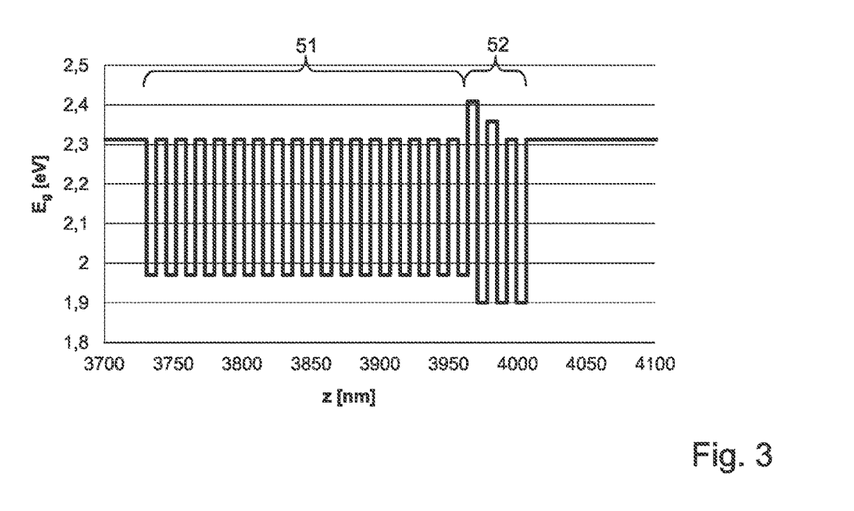

In the exemplified embodiment shown in FIG. 3, the barrier layers in the second region 52 have bandgaps of different size, with the bandgap becoming smaller towards the p-side. On the other hand, the quantum well layers in the second region 52 each have bandgaps of equal size.

Figure 4:
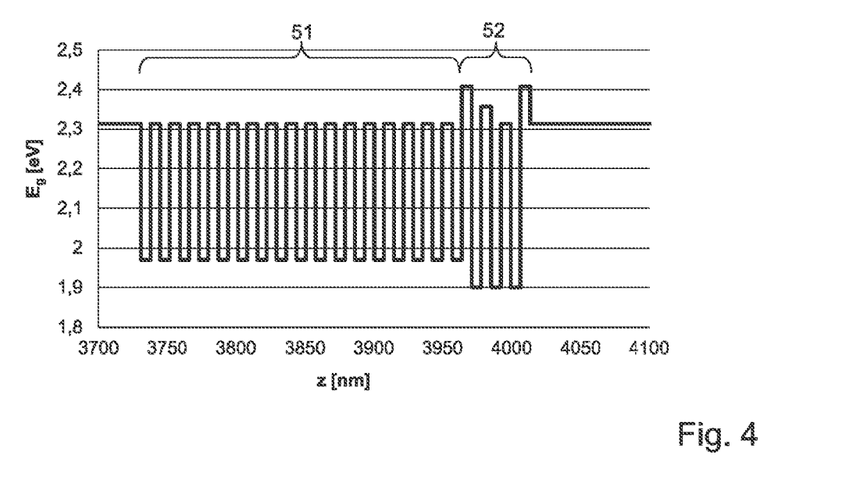

In the further exemplified embodiment shown in FIG. 4, the bandgap of the barrier layers in the second region 52 initially decreases towards the p-side, as is the case in the exemplified embodiment of FIG. 3, but the outermost barrier layer on the p-side returns to having a larger bandgap. As in the exemplified embodiment of FIG. 3, the bandgaps of the quantum well layers in the second region 52 are of equal size in the exemplified embodiment of FIG. 4.

Figure 5:
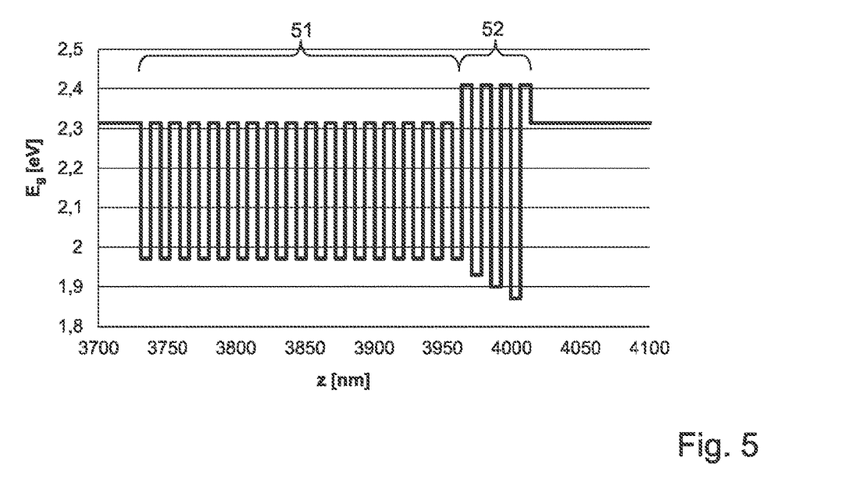

In the exemplified embodiment shown in FIG. 5, the barrier layers in the second region 52 have bandgaps of equal size, whereas the bandgaps of the quantum well layers decrease towards the p-side.

Figure 6:
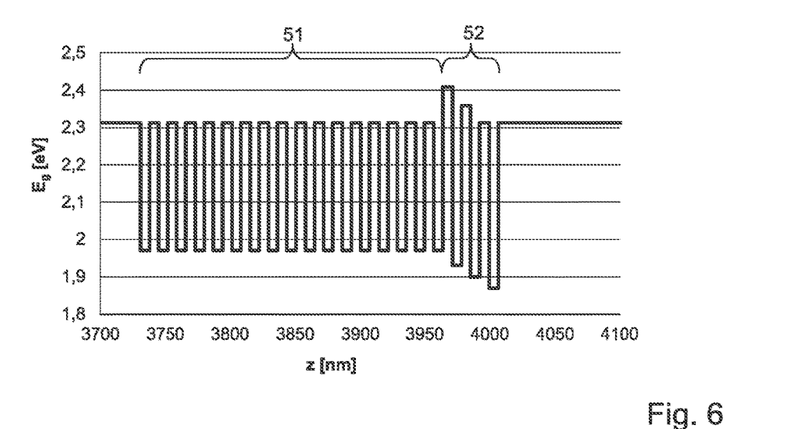

In the exemplified embodiment shown in FIG. 6, in the second region 52 both the bandgaps of the barrier layers and the bandgaps of the quantum well layers decrease towards the p-side.

Figure 7:
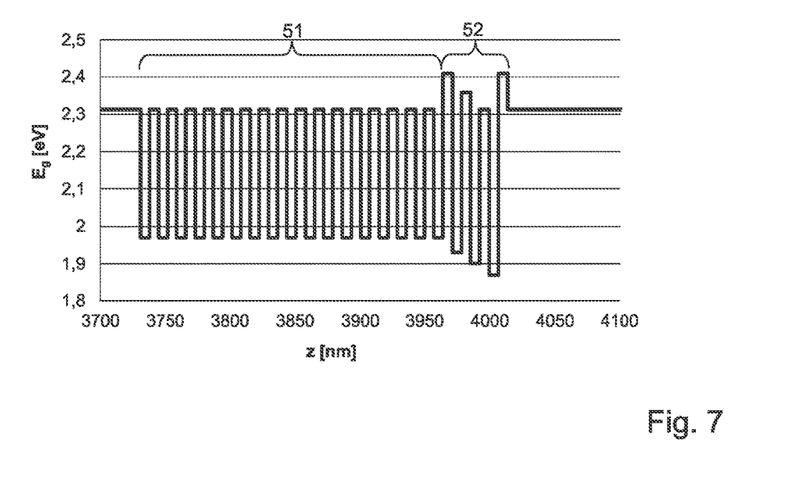

FIG. 7 also shows a further exemplified embodiment, in which, as in the exemplified embodiment of FIG. 6, the bandgaps of the barrier layers and the bandgaps of the quantum well layers in each case initially decrease towards the p-side, although the outermost barrier layer on the p-side returns to having a larger bandgap.

The exemplified embodiments of FIGS. 3 to 7 each have the common feature that the bandgap of the barrier layers and/or of the quantum well layers decrease towards the p-side, with the possible exception of the outermost barrier layer on the p-side, which preferably has a larger bandgap than the immediately preceding barrier layer.

The description referring to the exemplified embodiments does not limit the invention. Instead, the invention includes every novel feature and every combination of features, which in particular includes every combination of features in the claims, even if this feature or combination is not itself explicitly mentioned in the claims or exemplified embodiments.

The invention claimed is:

1. An optoelectronic semiconductor chip comprising:
a p-type semiconductor region;
an n-type semiconductor region;
an active layer arranged between the p-type semiconductor region and the n-type semiconductor region, wherein the active layer is embodied as a multiple quantum well structure, the multiple quantum well structure comprising:
a first region containing alternating first quantum well layers and first barrier layers; and
a second region containing at least one second quantum well layer and at least one second barrier layer,
wherein the at least one second quantum well layer has an electronic bandgap $EQW_2$ which is smaller than an electronic bandgap $EQW_1$ of the first quantum well layers,
wherein the at least one second barrier layer has an electronic bandgap $EB_2$ which is larger than an electronic bandgap $EB_1$ of the first barrier layers, and
wherein the second region is arranged closer to the p-type semiconductor region than is the first region.

2. The optoelectronic semiconductor chip as claimed in claim 1, wherein, for the electronic bandgaps of the first quantum well layers and of the at least one second quantum well layer, the following equation is true: $EQW_1 - EQW_2 \geq 0.025$ eV.

3. The optoelectronic semiconductor chip as claimed in claim 2, wherein, for the electronic bandgaps of the first barrier layers and of the at least one second barrier layer, the following equation is true: $EB_2 - EB_1 \geq 0.075$ eV.

4. The optoelectronic semiconductor chip as claimed in claim 1, wherein the first quantum well layers and the at least one second quantum well layer each contain InxAlyGal-x-yP, InxAlyGal-x-yN or InxAlyGal-x-yAs, where $0 \leq x \leq 1$, $0 \leq y \leq 1$ and $x+y \leq 1$.

5. The optoelectronic semiconductor chip as claimed in claim 4, wherein the aluminum content y of the first quantum well layers is greater than the aluminum content y of the at least one second quantum well layer.

6. The optoelectronic semiconductor chip as claimed in claim 4, wherein the indium content x of the first quantum well layers is less than the indium content x of the at least one second quantum well layer.

7. The optoelectronic semiconductor chip as claimed in claim 1, wherein the first barrier layers and the at least one second barrier layer each contain InxAlyGal-x-yP, InxAlyGal-x-yN or InxAlyGal-x-yAs, where $0 \leq x \leq 1$, $0 \leq y \leq 1$ and $x+y \leq 1$.

8. The optoelectronic semiconductor chip as claimed in claim 7, wherein the aluminum content y of the first barrier layers is less than the aluminum content y of the at least one second barrier layer.

9. The optoelectronic semiconductor chip as claimed in claim 7, wherein the indium content x of the first barrier layers is greater than the indium content x of the at least one second barrier layer.

10. The optoelectronic semiconductor chip as claimed in claim 1, wherein the first region comprises at least twenty layer pairs composed of the first quantum well layers and the first barrier layers.

11. The optoelectronic semiconductor chip as claimed in claim 1, wherein the second region comprises at least three layer pairs composed of the second quantum well layers and the second barrier layers.

12. The optoelectronic semiconductor chip as claimed in claim 1, wherein the first region comprises at least five times as many layer pairs as the second region.

13. The optoelectronic semiconductor chip as claimed in claim 1, wherein the first region comprises at least ten times as many layer pairs as the second region.

14. The optoelectronic semiconductor chip as claimed in claim 1, wherein, for a temperature rise of $T1=25°$ C. to $T2=85°$ C., a dominant wavelength of a radiation emitted by the active layer changes by less than $\pm_4$ nm.

15. The optoelectronic semiconductor chip as claimed in claim 1, wherein, for a temperature rise of $T1=25°$ C. to $T2=85°$ C., a dominant wavelength of a radiation emitted by the active layer does not change.

* * * * *